United States Patent
Stark et al.

(10) Patent No.: US 12,430,397 B2
(45) Date of Patent: Sep. 30, 2025

(54) CONVOLUTIONS WITH OPTICAL FINITE IMPULSE RESPONSE FILTERS

(71) Applicant: International Business Machines Corporation, Armonk, NY (US)

(72) Inventors: Pascal Stark, Thalwil (CH); Folkert Horst, Wettingen (CH); Roger F. Dangel, Zug (CH); Bert Jan Offrein, Schoenenberg (CH); Lorenz K. Muller, Dubendorf (CH)

(73) Assignee: International Business Machines Corporation, Armonk, NY (US)

( * ) Notice: Subject to any disclaimer, the term of this patent is extended or adjusted under 35 U.S.C. 154(b) by 832 days.

(21) Appl. No.: 17/451,550

(22) Filed: Oct. 20, 2021

(65) Prior Publication Data

US 2023/0118621 A1    Apr. 20, 2023

(51) Int. Cl.
*G06F 17/15* (2006.01)
*H03H 17/00* (2006.01)

(52) U.S. Cl.
CPC ... *G06F 17/153* (2013.01); *H03H 2017/0081* (2013.01); *H03H 2218/12* (2013.01)

(58) Field of Classification Search
CPC ............ G06F 17/15–153; G06N 3/067; G06N 3/0675
See application file for complete search history.

(56) References Cited

U.S. PATENT DOCUMENTS

| 8,976,445 B1 | 3/2015 | Willner et al. |
| 2017/0054510 A1 | 2/2017 | Zortea et al. |
| 2019/0019100 A1 | 1/2019 | Roques-Carmes et al. |
| 2019/0370644 A1 | 12/2019 | Kenney et al. |
| 2020/0363660 A1* | 11/2020 | Nakajima ............... G06N 3/067 |
| 2021/0192325 A1* | 6/2021 | Hoang ............... G11C 13/0069 |

(Continued)

FOREIGN PATENT DOCUMENTS

| CN | 110516802 A | 11/2019 |
| WO | 2020102204 A1 | 5/2020 |

OTHER PUBLICATIONS

Ahmed et al., "Integrated Photonic FFT for Optical Convolutions towards Efficient and High-Speed Neural Networks," https://arxiv.org/vc/arxiv/papers/2002/2002.01308v1.pdf, 12 pgs.

(Continued)

*Primary Examiner* — Carlo Waje
(74) *Attorney, Agent, or Firm* — Kimberly Zillig (57) ABSTRACT

A method of processing data and related apparatuses. The method relies on an optical finite impulse response (FIR) filter. This optical FIR filter comprises several delay stages having weights set in accordance with parameters of a transformation to be applied by the optical FIR filter. Each of the delay stages is configured to impose a delay matched to a given input data period corresponding to a given input sample rate. According to the method, an optical signal is coupled into the optical FIR filter. The optical signal carries a data stream of input samples encoded at the given input sample rate; the data stream represents the data to be processed. Next, output samples are collected from an output data stream carried by an output optical signal obtained in output of the optical FIR filter. A set of output samples are obtained, which are representative of processed data.

18 Claims, 7 Drawing Sheets

(56) References Cited

U.S. PATENT DOCUMENTS

2024/0250755 A1* 7/2024 Nakajima ............ H04B 10/67

OTHER PUBLICATIONS

Bagherian et al., "On-Chip Optical Convolutional Neural Networks," arXiv:1808.03303v 2 [cs.ET] Aug. 16, 2018, 18 pgs.

Farabet, et al., "NeuFlow_A Runtime Reconfigurable Dataflow Processor for Vision," CVPR 2011 Workshops, 2011, pp. 109-116, doi: 10.1109/CVPRW.2011.5981829.

Feldman et al., "Parallel convolutional processing using an integrated photonic tensor core," https://www.nature.com/articles/s41586-020-03070-1#citeas), Nature, vol. 589, Jan. 7, 2021, 10 pgs.

Horst et al., "Cascaded Mach-Zehnder wavelength filters in silicon photonics for low loss and flat pass-band WDM (de-)multiplexing," https://www.osapublishing.org/oe/abstract.cfm?uri=oe-21-10-11652, 7 pgs., © 2013 Optical Society of America.

Horst et al., "Compact tunable FIR dispersion compensator in SiON technology," in IEEE Photonics Technology Letters, vol. 15, No. 11, pp. 1570-1572, Nov. 2003, doi: 10.1109/LPT.2003.818671.

Jinguji, K., "Synthesis of Coherent Two-Port Optical Delay-Line Circuit with Ring Waveguides," Journal of Lightwave Technology, 14(8), pp. 1882-1898, Aug. 1996, 17 pgs.

Mehrabian et al., "PCNNA: A Photonic Convolutional Neural Network Accelerator," https://arxiv.org/abs/1807.08792, © 2018 IEEE.

Mehrabian, et al., "A Winograd-Based Integrated Photonics Accelerator for Convolutional Neural Networks," in IEEE Journal of Selected Topics in Quantum Electronics, vol. 26, No. 1, pp. 1-12, Jan.-Feb. 2020, Art No. 6100312, doi: 10.1109/JSTQE.2019.2957443.

Morcel et al., "FeatherNet: An Accelerated Convolutional Neural Network Design for Resource-constrained FPGAs," ACM Transactions on Reconfigurable Technology and Systems, vol. 12, Issue 2, Jun. 2019 Article No. 6 pp. 1-27, https://doi.org/10.1145/3306202.

Reuther, et al., "Survey and Benchmarking of Machine Learning Accelerators," 2019 IEEE High Performance Extreme Computing Conference (HPEC), 2019, pp. 1-9, doi: 10.1109/HPEC.2019.8916327.

Unknown, "Blurring an Image," https://developer.apple.com/documentation/accelerate/blurring_an_image, printed Oct. 15, 2021, 10 pgs.

* cited by examiner

| Electrical FIR filter weights | - | $w_0$ | $w_1$ | $w_2$ | $w_3$ | $w_4$ | $w_5$ | $w_6$ | $w_7$ | $w_8$ | |
|---|---|---|---|---|---|---|---|---|---|---|---|
| #t　　　　Kernel weights | *In* | $o_{22}$ | $o_{12}$ | $o_{02}$ | $o_{21}$ | $o_{11}$ | $o_{01}$ | $o_{20}$ | $o_{10}$ | $o_{00}$ | *Out* |
| 0 | $a_{00}$ | $a_{00}$ | 0 | 0 | 0 | 0 | 0 | 0 | 0 | 0 | - |
| 1 | $a_{10}$ | $a_{10}$ | $a_{00}$ | 0 | 0 | 0 | 0 | 0 | 0 | 0 | - |
| 2 | $a_{20}$ | $a_{20}$ | $a_{10}$ | $a_{00}$ | 0 | 0 | 0 | 0 | 0 | 0 | - |
| 3 | $a_{01}$ | $a_{01}$ | $a_{20}$ | $a_{10}$ | $a_{00}$ | 0 | 0 | 0 | 0 | 0 | - |
| 4 | $a_{11}$ | $a_{11}$ | $a_{01}$ | $a_{20}$ | $a_{10}$ | $a_{00}$ | 0 | 0 | 0 | 0 | - |
| 5 | $a_{21}$ | $a_{21}$ | $a_{11}$ | $a_{01}$ | $a_{20}$ | $a_{10}$ | $a_{00}$ | 0 | 0 | 0 | - |
| 6 | $a_{02}$ | $a_{02}$ | $a_{21}$ | $a_{11}$ | $a_{01}$ | $a_{20}$ | $a_{10}$ | $a_{00}$ | 0 | 0 | - |
| 7 | $a_{12}$ | $a_{12}$ | $a_{02}$ | $a_{21}$ | $a_{11}$ | $a_{01}$ | $a_{20}$ | $a_{10}$ | $a_{00}$ | 0 | - |
| 8 | $a_{22}$ | $a_{22}$ | $a_{12}$ | $a_{02}$ | $a_{21}$ | $a_{11}$ | $a_{01}$ | $a_{20}$ | $a_{10}$ | $a_{00}$ | $x_1$ |
| 9 | $a_{03}$ | $a_{03}$ | $a_{22}$ | $a_{12}$ | $a_{02}$ | $a_{21}$ | $a_{11}$ | $a_{01}$ | $a_{20}$ | $a_{10}$ | - |
| 10 | $a_{13}$ | $a_{13}$ | $a_{03}$ | $a_{22}$ | $a_{12}$ | $a_{02}$ | $a_{21}$ | $a_{11}$ | $a_{01}$ | $a_{20}$ | - |
| 11 | $a_{23}$ | $a_{23}$ | $a_{13}$ | $a_{03}$ | $a_{22}$ | $a_{12}$ | $a_{02}$ | $a_{21}$ | $a_{11}$ | $a_{01}$ | $x_2$ |
| .. | ... | ... | ... | ... | ... | ... | ... | ... | ... | ... | ... |
| 14 | $a_{24}$ | $a_{24}$ | $a_{14}$ | $a_{04}$ | $a_{23}$ | $a_{13}$ | $a_{03}$ | $a_{22}$ | $a_{12}$ | $a_{02}$ | $x_3$ |
| .. | ... | ... | ... | ... | ... | ... | ... | ... | ... | ... | ... |

CONVOLUTIONS WITH OPTICAL FINITE IMPULSE RESPONSE FILTERS

STATEMENT REGARDING FEDERALLY SPONSORED RESEARCH OR DEVELOPMENT

The project leading to this application has received funding from the Swiss national science foundation (SNF) under SNF grant 175801 (project name "Novel Architectures for Photonic Reservoir Computing").

BACKGROUND

The disclosure relates in general to the field of methods and apparatuses for processing data using finite impulse response (FIR) filters, the aim being to apply a transformation to input data. In particular, it is directed to methods and apparatuses that rely on an optical FIR filter, wherein the optical FIR filter includes several delay stages having weights set in accordance with parameters of the transformation to be applied by the optical FIR filter. Each of the delay stages imposes a delay matched to an input data period corresponding to an input sample rate.

SUMMARY

According to a first aspect, the present disclosure is embodied as a method of processing data. The method relies on an optical finite impulse response filter, or optical FIR filter. This optical FIR filter comprises several delay stages having weights set in accordance with parameters of a transformation to be applied by the optical FIR filter. Each of the delay stages is configured to impose a delay matched to a given input data period corresponding to a given input sample rate. According to the proposed method, an optical signal is coupled into the optical FIR filter. The optical signal forms a data stream of input samples encoded at the given input sample rate; the data stream represents the data to be processed. Next, output samples are collected from an output data stream carried by an output optical signal obtained in output of the optical FIR filter. A set of output samples are obtained, which are representative of processed data.

The method may typically comprise an additional step of reconstructing transformed data based on the set of the output samples obtained. Note, the output samples are preferably collected by sub-sampling (also known as down-sampling) output samples in the output data stream. This is done at a sub-sampling rate that is determined in accordance with the parameters of the transformation applied by the optical FIR filter.

The transformation applied may notably be an r-dimensional convolution, where $r \geq 1$. The convolution has a kernel of size $k^r$ with given kernel values. In preferred embodiments, r is larger than or equal to 2, and the optical FIR filter comprises at least $k^r - 1$ delay stages, the weights of which are set in accordance with the given kernel values. In that case, the output samples are collected by sub-sampling the output samples in the output data stream at a sub-sampling rate of $k^{1-r}$, whereby the set of output samples obtained is a selection of the output samples carried in the output data stream. That is, the selection includes every $k^{r-1}$-th sample of at least a subset of the output samples in the output data stream.

The data to be transformed can be d-dimensional data, where $d \geq 2$. In that case, the method further comprises, prior to coupling the optical signal into optical input of the optical FIR filter, scanning through the d-dimensional data according to a predetermined scan path. The weights of the delay stages are further set in accordance with the given kernel values, consistently with the predetermined scan path.

The optical FIR filter is preferably a lattice filter in two-port lattice form. That is, the lattice filter includes a plurality of four-terminal lattice filter stages that are optically coupled in series. Each of the four-terminal lattice filter stages may further comprise phase shifters, such as thermo-optic phase shifters. In this case, the method may further comprise, tuning each of the phase shifters to set the weights in accordance with the parameters of the transformation to be applied, prior to coupling the optical signal into the optical input of the optical FIR filter.

According to another aspect, the disclosure is embodied as an apparatus for processing data. Consistently with the above embodiments, the apparatus includes an optical FIR filter, e.g., a lattice filter, which comprising several delay stages having weights set in accordance with parameters of a transformation to be applied by the optical FIR filter. Each of the delay stages is configured to impose a delay matched to a given input data period corresponding to a given input sample rate. The apparatus further includes a transmitter connected to an optical input of the optical FIR filter and configured to couple an optical signal into the optical FIR filter. In operation, the optical signal carries a data stream of input samples encoded at the given input sample rate; the data stream represents data to be processed. The apparatus further includes a receiver connected to an optical output of the optical FIR filter and configured to collect output samples in an output data stream carried by an output optical signal obtained in output of the optical FIR filter to obtain a set of output samples that are representative of the transformation. The apparatus preferably comprises a silicon photonic chip, which includes the optical FIR filter.

The above summary is not intended to describe each illustrated embodiment or every implementation of the present disclosure.

BRIEF DESCRIPTION OF THE DRAWINGS

These and other objects, features and advantages of the present disclosure will become apparent from the following detailed description of illustrative embodiments thereof, which is to be read in connection with the accompanying drawings. The illustrations are for clarity in facilitating one skilled in the art in understanding the disclosure in conjunction with the detailed description. The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIGS. 5A, 5B, and 5C illustrate an implementation of an optical lattice filter with four convolutional stages, according to embodiments.

The accompanying drawings show simplified representations of apparatuses or parts thereof, as involved in embodiments. Technical features depicted in the drawings are not necessarily to scale. Similar or functionally similar elements in the figures have been allocated the same numeral references, unless otherwise indicated.

DETAILED DESCRIPTION OF EMBODIMENTS OF THE DISCLOSURE

Massive amounts of data are generated each year and the growth in volume accelerates quickly. Most of the data is unstructured, rendering processing and information extraction challenging. This phenomenon has contributed to reviving artificial intelligence (AI); cognitive models such as artificial neural networks (ANNs) are being routinely used to extract and process such data. As the dimensions of the cognitive models used are rapidly growing too, the data processing with traditional digital electronic circuits is becoming relatively inefficient, in terms of both computational time and required energy.

Now, optical computing can potentially overcome this bottleneck as it inherently allows large bandwidth, massive parallelism, and low latency. Furthermore, it may drastically improve the energy efficiency of computations, thereby reducing the environmental impact of AI workloads. However, cost-effective scaling and integration of optical systems with existing electronic systems is of uttermost importance for optical systems to break out of niche applications. Integrated silicon photonics has majored as a technology over the last decades and now reaches excellent technological readiness. It provides the means for economical large-scale fabrication and can be integrated with electronic systems with reasonable overhead, hence enabling a general adaption of optical computing in data centers.

An important class of data processing operations deals with data transformations such as convolutions. Convolutions are an essential basic building of all convolutional neural networks. Convolutions are notably used in image processing, for example for edge detection, blurring, sharpening, etc. There is a need for specialized hardware that enables convolutional operations with high throughput, low latency, and high energy efficiency. Convolutional accelerators are already known, which can be used to improve computations of convolutions in terms of throughput and/or latency, and/or improve the energy efficiency.

A finite impulse response (FIR) filter is a filter whose response to a finite length input (also known as impulse response) is of finite duration. That is, the filter settles to zero in finite time, in contrast to infinite impulse response filters that respond indefinitely, although the response signal usually decays. Electronic FIR filters can notably be used to compute a convolution of a time-discrete input signal with a finite convolution kernel defined by the filter coefficients. FIR filters can be implemented in different circuit architectures.

Optical FIR filters are optical implementations of electronic FIR filters. A straightforward way to implement an optical FIR filter is to replace the electrical components of an electronic FIR filter by their optical counterparts, e.g., the delay elements are replaced by optical delay lines (long fibers or waveguides), optical splitters and combiners replace electronic counterparts, and the weighting can be implemented through tunable splitters/combiners.

Apparatuses and methods embodying the present disclosure will now be described, by way of non-limiting examples.

In reference to FIGS. 1-3B and 6, an aspect of the disclosure is first described, which concerns a method of processing data though a transformation such as a convolution between a given kernel and the data. Note, the present method and its variants are collectively referred to as "the present methods." All references to Sn refer to methods steps of the flowchart of FIG. 6, while numeral references pertain to physical parts or components of the apparatuses (or parts thereof) shown in FIGS. 1-3B, and 5A-C.

Figure 1:
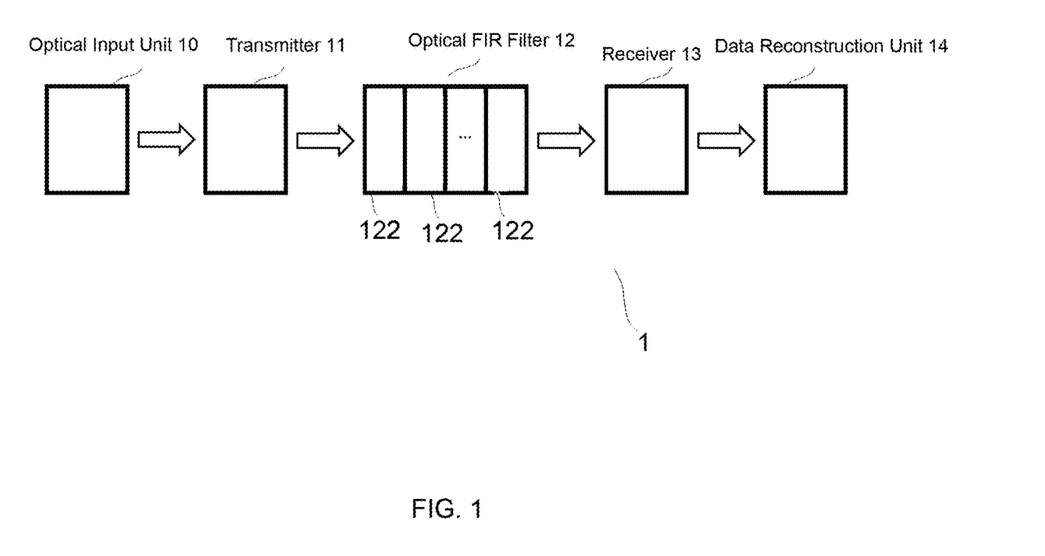
FIG. 1 is a diagram schematically illustrating components of an apparatus for processing data, according in embodiments.
Figure 2A:
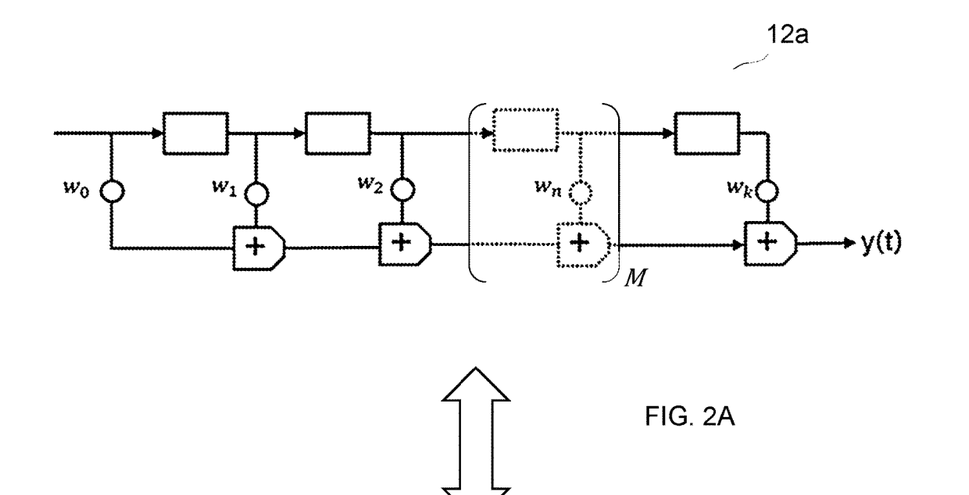
FIGS. 2A and 2B schematically illustrate the correspondence between an electronic finite impulse response (FIR) filter (FIG. 2A, not according to embodiments), and an optical FIR filter (FIG. 2B), as used in embodiments.
Figure 2B:
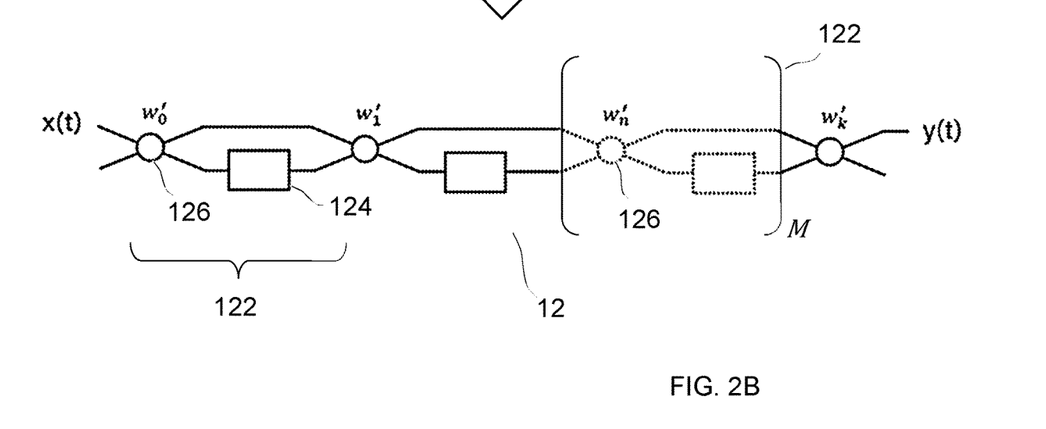

The proposed method relies on an optical FIR filter 12. This method may be performed using an apparatus 1 such as shown in FIG. 1, which concerns another aspect of the disclosure, which is described later in detail. As seen in FIGS. 1 and 2B, the optical FIR filter 12 comprises several delay stages 122. The delay stages 122 have respective weights 126, referred to as $w_0'$, $w_1'$, ... in FIG. 2B. Such weights 126 can be related to counterpart weights $w_0$, $w_1$, ... as used in an electronic (alternatively referred to as "electrical" or "electric") FIR filter 12a, a typical structure of which is shown in FIG. 2A.

According to the present approach, the weights 126 of the optical FIR filter 12 must be set in accordance with parameters of the transformation intended to be applied via the optical FIR filter 12. In addition, each of the delay stages 122 must be configured to impose a delay (symbolized by boxes 124 in FIG. 2B), where this delay 124 is matched to a given input data period corresponding to a given input sample rate. That is, the method assumes that an optical FIR filter 12 can be suitably configured for the purpose of transforming data, as exemplified later in reference to steps S10-S40 of the flowchart of FIG. 6.

Figure 6:
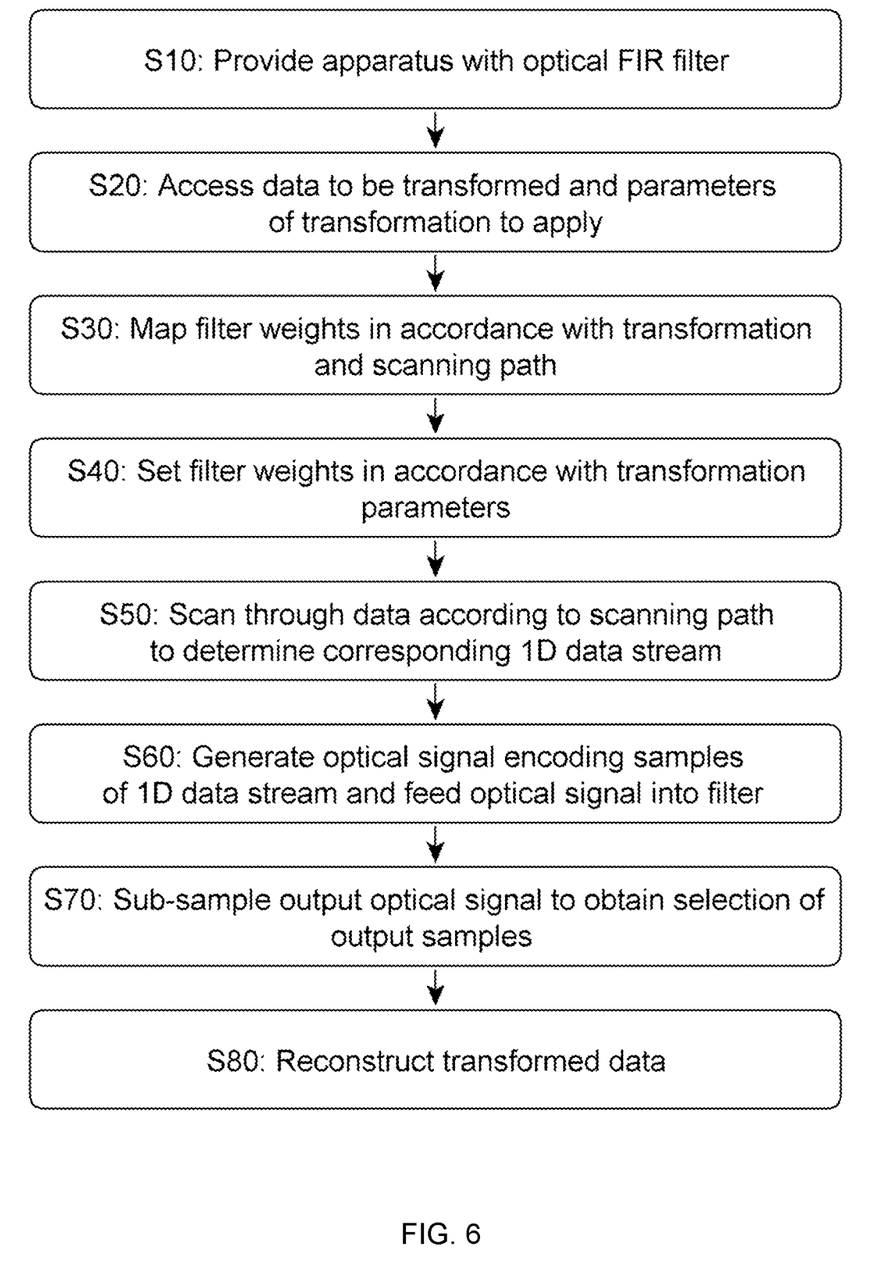
FIG. 6 is a flowchart illustrating high-level steps of a method of transforming data using such an optical lattice filter, according to embodiments.

Under the above assumptions, an optical signal is coupled into the optical FIR filter 12; this corresponds to step S60 in the flowchart of FIG. 6. The optical signal carries a data stream of input samples. The data stream represents the data to be processed. The input samples are encoded at a given input sample rate, i.e., this rate corresponds to a data period to which the delays 124 of the optical FIR filter 12 are matched. The mapping of the filter weights 126 to the particulars of the transformation to be applied (e.g., kernel elements for convolutions) depends on the mapping of the initial data onto the data stream, as discussed later in reference to embodiments.

Next, output samples are collected (at step S70) in the output data stream carried by the output optical signal that is obtained in output of the optical FIR filter 12. This way, a set of output samples are obtained, which are representative of the processed data. This set of output samples obtained may thus be used to reconstruct transformed data, i.e., the present methods preferably include an additional step S80 of reconstructing transformed data based on the set of the output samples obtained at step S70.

The proposed solution can be applied to any type of data, notably for d-dimensional data, where d≥2, e.g., such data may represent an image (2D or three-dimensional (3D)), or video frames. In such cases, a suitable scan path is used to suitably explore the d-dimensional data, such that the data scanned can be mapped onto an input data stream. The transformation applied can notably be an r-dimensional convolution or any linear transformation involving a kernel. In fact, the present solution can also be applied to other types of transformations, such as feed-forward equalizations in optical links.

The present inventors have realized that it is possible to efficiently process data, optically, through a transformation such as a convolution by sequentially feeding optical signal samples encoding a data stream carried by an optical signal to an optical FIR filter, provided that the delays of this filter are matched to the period of the input data. The proposed approach makes it possible to efficiently handle the data. Compared to electrical or electronic FIR filters, optical FIR filters allow high bandwidths of input data with power-efficient transformations. Even though an optical filter is being used, it is possible to quickly update the weights of the optical FIR filter, using procedures explained later in this disclosure. The present approach can notably be implemented using new silicon photonic accelerators, e.g., as part of new photonic platforms allowing optical signal processing and all-optical computing.

All this is now described in detail, in reference to particular embodiments of the disclosure. In preferred embodiments, the transformation applied is an r-dimensional convolution, where r≥1. The convolution has a kernel of size $k^r$, involving given kernel values. The transformation may notably be a mere one-dimensional (1D) convolution, in which case r=1. In other cases, it may be a 2D or 3D convolution (r>1), for example. In variants to convolutions, the transformation may for example be a feed-forward equalization, as noted above. In that case, the data to be transformed are simply mapped to a 1D data stream, whereas r-dimensional convolutions of d-dimensional data (d≥2) requires scanning the target data through a carefully chosen scan path, to map the data obtained onto a data stream that is next fed to the optical FIR filter 12.

Depending on the intended transformation, the output samples may have to be collected by sub-sampling (also known as down-sampling) (step S70 in FIG. 6) the optical samples in the output data stream. That is, output samples are selected at a sub-sampling rate that is determined in accordance with the parameters of the transformation to be applied by the optical FIR filter 12. As a result, the set of output samples obtained is only a selection (i.e., a subset) of the samples carried in the signal outputted by the optical FIR filter 12. This is especially important when performing an r-dimensional convolution operation, where r>1, because only a subset of the output samples represents a valid convolution. Moreover, since the data may have boundaries (as, e.g., in images), only a subset of the output samples may actually be sub-sampled to produce the useful set of output samples.

For example, when the goal is to apply an r-dimensional convolution operation, with r≥2, the optical FIR filter 12 should comprise at least $k^r-1$ delay stages 122, where the delay stages 122 have weights 126 that are set in accordance with the kernel values of the transformation to be applied. In that case, the output samples are collected (step S70 in FIG. 6) by sub-sampling the samples in the output data stream at a sub-sampling rate of $1/k^{r-1}=k^{1-r}$. Thus, the set of output samples obtained is a selection of the samples carried in the output data stream. As noted above, the sub-sampling may only concern a subset of the output samples contained in the output data stream, e.g., to take boundaries into account. Thus, the selection may restrict to every $k^{r-1}$-th sample of a subset (at least) of the samples contained in the output data stream. It can indeed be verified that every $k^{r-1}$-th output sample represents a valid convolution in that case. Note, if r=1, $k^{r-1}=1$, meaning that every sample (of at least a subset of the output samples) is collected, i.e., no sub-sampling is performed in that case.

Data boundaries may sometimes need be handled with care. Several methods are known in the art. For example, when dealing with 2D or 3D input images, one way of taking care of boundaries is to pad the input data representing the image, e.g., to extend the image with 0-values around all edges, as known in the art.

Figure 4A:
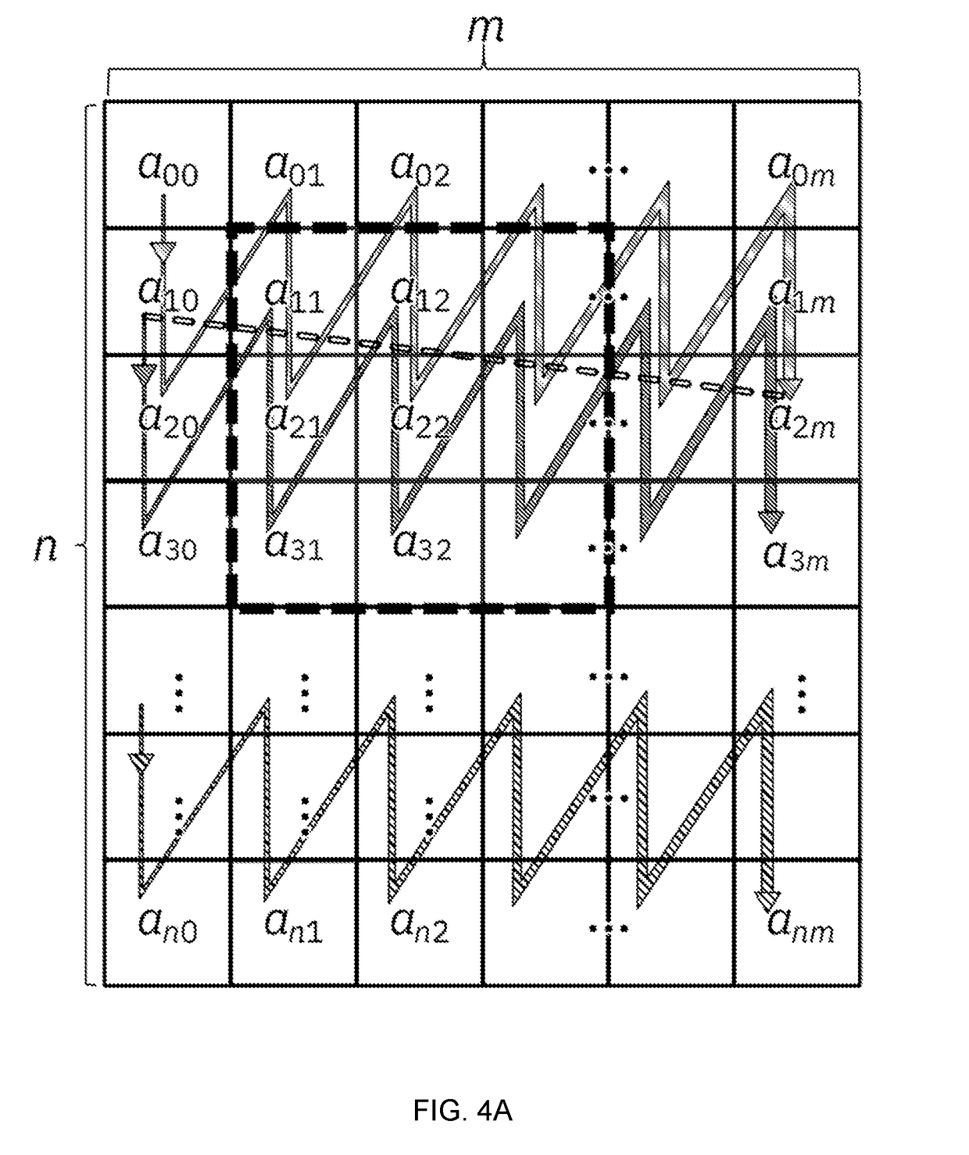
FIG. 4A schematically illustrates a scan path used to scan through two-dimensional (2D) data.

Beyond 2D or 3D images, the data to be transformed may be any type of d-dimensional data, with d≥2, such as matrices and tensors. In all cases, the initial data will have to be suitably mapped onto a 1D data stream. To that aim, the present methods may further comprise a scanning step (step S50 in FIG. 6), prior to coupling the optical signal into the optical input of the optical FIR filter 12. That is, an algorithm is run to scan (step S50) through the d-dimensional data according to a predetermined scan path, as illustrated in FIG. 4A. Several scanning algorithms are known in the art, which can be readily used for the present purpose.

In the example of FIG. 4A, the transformation to be applied is a 3×3 convolution (r=2), the kernel of which can be written:

$$\begin{pmatrix} o_{00} & o_{01} & o_{02} \\ o_{10} & o_{11} & o_{12} \\ o_{20} & o_{21} & o_{22} \end{pmatrix}.$$

To compute an r-dimensional convolution with an optical FIR filter, one must convert the input data into a sequence. FIG. 4A show a full scan path to compute a convolution with a 3×3 kernel across an image (d=2) of size n×m. The kernel window (represented by a rectangle with dashed sides) slides across the image from left to right, before moving to the next row (see the slanted dashed line), hence the vertical depth of each intermediate paths (patterned sawtooth lines), corresponding to k=3. The scan path reflects an ordered, regular path that feeds in the $k^r$ pixel value at each kernel window position sequentially to the input of the optical FIR filter. That is, the pixel values of the image are applied sequentially to the input of the optical FIR filter, following a scan path corresponding to a respective kernel window. Note, the values that overlap between neighboring kernel window positions can be reused; each such value is fed to the optical FIR filter only once, as long as the value is still present in the memory of the optical FIR filter. Thus, neglecting edge effects each pixel value is fed only k times to the system, although the value is used in $k^2$ convolutions across the image.

Neglecting edge effects, every third time step the output of the system corresponds to a convolution with the desired rectangular kernel. At intermediate timesteps the shape of the kernel applied is non-rectangular, as the pixel values are fed sequentially to the input of the optical FIR filter following the scan path (FIG. 4A) and the output at these intermediate timesteps must be disregarded, i.e., every $k^{r-1}$-th output is an output that computes a desired convolution ($k^{r-1}=k$ in that case, since r=2). Neglecting edge effects, the number of images processed per second is given by images/s~data rate/(n m k).

Figure 4B:
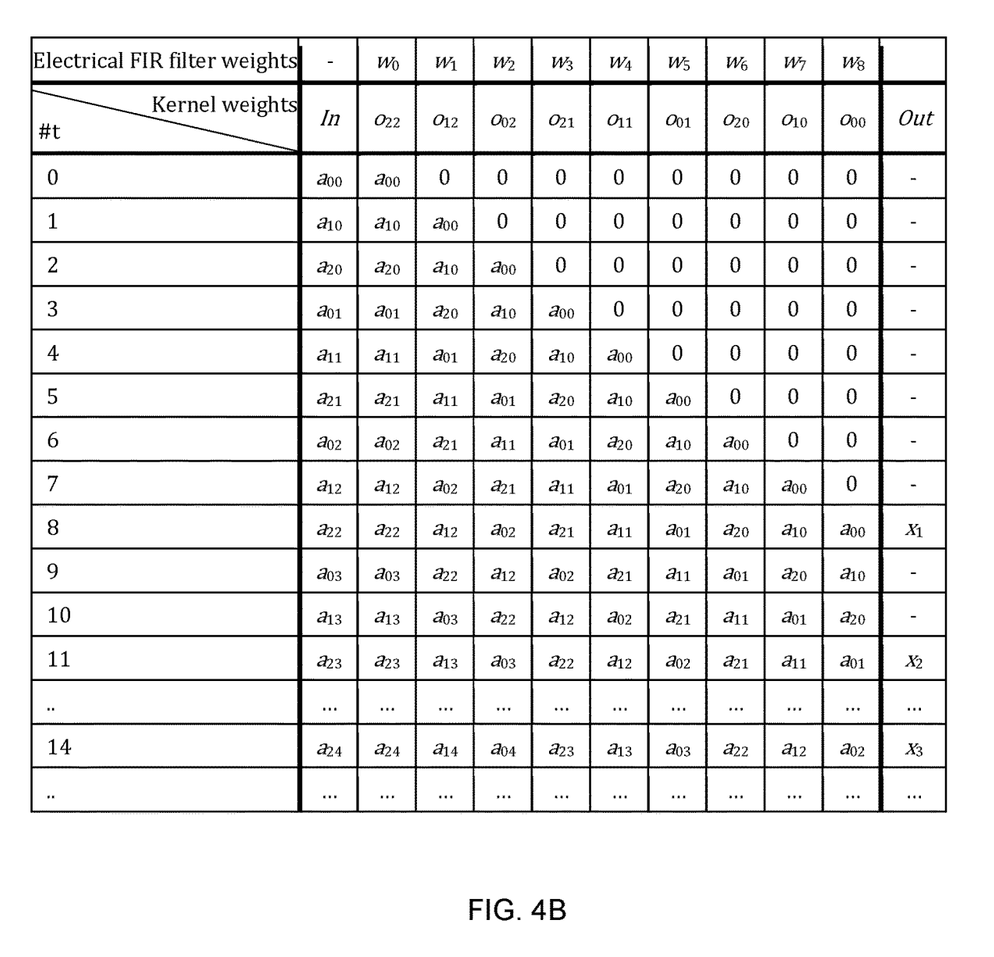
FIG. 4B shows how the weights of the delay stage of the electrical FIR filter can be mapped in accordance with parameters of the transformation to be applied (here a 2D convolution with a 3×3 kernel), as in embodiments.

The input sequence resulting from scan paths shown in FIG. 4A is $[a_{00}, a_{10}, a_{20}, a_{01}, a_{11}, a_{21}, \ldots, a_{0m}, a_{1m}, a_{2m}, a_{10}, a_{20}, a_{30}, \ldots, a_{n-2m}, a_{n-1m}, a_{nm}]$, as seen in FIG. 4B. A suitable mapping must be devised between weights $w_0, w_1, \ldots,$ of the corresponding electrical FIR filter and weights $w_0', w_1', \ldots,$ of the optical FIR filter 12 used, see FIGS. 2A and 2B. This mapping is known in prior art. Before converting the electrical FIR weights to optical FIR weights, the kernel weights must be mapped to the weights of the electrical FIR filter in accordance with the scan path. In FIG. 4B, the kernel weights are noted $o_{22}, o_{12}, o_{02}, \ldots, o_{00}$ in the header of the table, which further show their correspondence to weights $w_0, w_1, \ldots, w_8$ of the electrical FIR filter. The coefficients $a_{ij}$ shown in the rows under the weights in FIG. 4B correspond to input samples (signals) to the optical FIR filter. Thus, two mappings are involved, including a mapping of the kernel weights to corresponding filter weights in an electrical FIR filter; and a mapping of the electrical FIR filter weights to the optical FIR implementation. Output samples are listed in the last column. Only the outputs noted $x_1, x_2,$ and $x_3$ would be selected in that purposely simple example, owing to the imposed sub-sampling scheme.

As illustrated above, the weights 126 of the delay stages 122 must not only be set in accordance with the kernel values, but also consistently with the scan path. For each kernel window position, the scan path must include all pixels within the kernel hyper volume. Preferably, the values that are used in convolutions at subsequent kernel positions are last in the sequence, such that they can be reused, and these values must not be fed again to the input of the optical FIR filter as long as they remain in its memory. More generally, the optimal scan path depends on the data to be processed. For example, when dealing with video frames, the scan path has to extend through the successive frames.

Referring to FIGS. 1, 2A, 3A-B, and 5A-C, another aspect of the disclosure is now described, which concerns an apparatus 1 for processing data. Some features of this apparatus 1 have already been described, be it implicitly, in reference to the present methods. Conversely, the present methods may use features of this apparatus 1 and its variants.

Basically, the apparatus 1 includes an optical FIR filter 12 as described earlier in reference to the present methods, i.e., the optical FIR filter 12 comprises several delay stages 122, which have weights 126 set in accordance with parameters of the transformation to be applied by the optical FIR filter 12. As said, each delay stage 122 is configured to impose a delay 124 matched to a given input data period, which corresponds to a given input sample rate. The apparatus 1 further comprises a transmitter 11, see FIG. 1. The transmitter 11 is connected to an optical input unit 10 of the optical FIR filter 12 and configured to couple an optical signal into the optical FIR filter 12. In operation, the optical signal carries a data stream of input samples encoded at the given input sample rate; this data stream represents the data to be processed. As further seen in FIG. 1, the apparatus 1 additionally includes a receiver 13, which is connected to an optical output of the optical FIR filter 12. The receiver 13 is configured to collect output samples in the output data stream carried by the output optical signal obtained in output of the optical FIR filter 12. This makes it possible to obtain a set of output samples that are representative of the transformation performed by the optical FIR filter, in operation.

As also seen in FIG. 1, the apparatus 1 preferably includes a data reconstruction unit 14, which is connected to the receiver 13. The data reconstruction unit 14 is configured to reconstruct transformed data based on the set of the output samples obtained in output of the receiver 13, in operation. Like unit 10 used to provide the initial data, the data reconstruction unit 14 may typically be a computer, a laptop, etc., which is suitably interfaced with the receiver 13, e.g., via an analogic-to-digital converter. The unit 10, transmitter 11, receiver 13, and data reconstruction unit 14 involved in the present apparatus 1 are independently known, as such, in the prior art. They merely need to be connected and configured to serve the present purpose, i.e., provide initial data, convert them to a 1D data stream encoded as an optical signal, feed the optical signal into the optical FIR filter 12, suitably collect output samples, and reconstruct data.

Consistently with the present methods, the receiver 13 may be configured to collect the output samples by sub-sampling (or down-sampling) such output samples in the output data stream. As explained herein in reference to FIGS. 5A and 5B, this is performed at a sub-sampling rate determined in accordance with the parameters of the transformation applied by the optical FIR filter 12.

The optical FIR filter 12 may notably be a lattice filter, as assumed in FIGS. 3A-B and 5A-C. More precisely, the optical FIR filter 12 is preferably a lattice filter in two-port lattice form. That is, the lattice filter 12 includes a plurality of four-terminal lattice filter stages 122, where the stages 122 are optically coupled in series. Actually, each lattice filter stage 122 is a four-terminal unit, which includes two input terminals and two output terminals, see FIG. 3A. In literature, the terminology "two-port lattice form" is often used to describe such an architecture. Still, in the present case, the lattice filter stages 122 are connected two-by-two, in series, meaning that the two output terminals of one stage 122 are respectively connected to the two input terminals of the next stage. As a whole, such an architecture draws a two-port system.

Figure 3A:
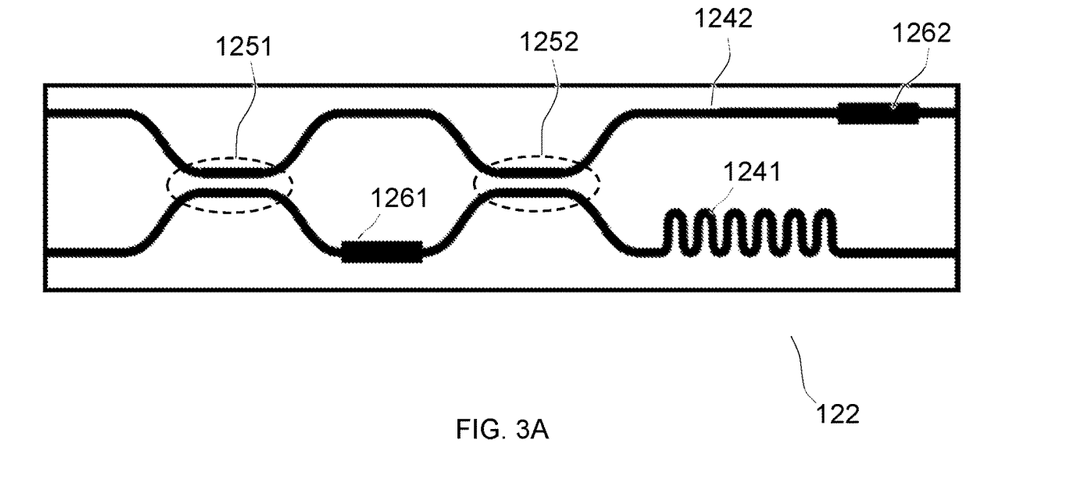
FIG. 3A is a schematic top view of one delay stage of an optical FIR filter as involved in embodiments. The filter is a lattice filter in a two-port lattice form; the delay stages are four-terminal stages that are optically connected in series, as shown in FIG. 3B. Note, the actual, on-chip layout may actually differ from the apparent layout shown in FIGS. 3A and 3B, as illustrated in FIGS. 5A and 5B.
Figure 3B:
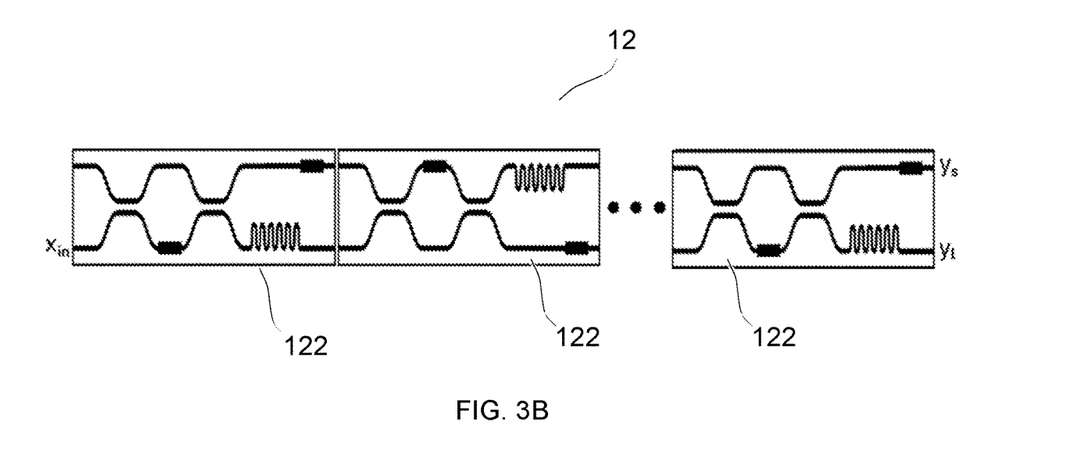

As best seen in FIGS. 3A and 3B, each of the four-terminal lattice filter stages may for instance comprise two waveguides 1241, 1242 and two phase shifters 1261, 1262. The two phase shifters 1261, 1262 are formed at respective portions of the two waveguides 1241, 1242. In each of the four-terminal stages, the two waveguides 1241, 1242 are arranged so as to form two directional couplers 1251, 1252. Such a configuration effectively forms a Mach-Zehnder interferometer (MZI). Moreover, a length difference between the optical paths enabled by the two waveguides 1241, 1242 can be designed so that the propagation delay difference between the optical paths corresponds to the input data period.

There are two phase shifters 1261, 1262 formed at respective waveguides 1241, 1242, also called "arms". More precisely, each phase shifter 1261, 1262 is formed by a combination of a waveguide portion and an additional element. This additional element can for example be a heater (129 in FIGS. 5B and 5C). In that case, the phase shifter 1261, 1262 is a thermo-optic phase shifter. In variant, this additional element may include electric (e.g., electrodes) or electronic components (e.g., P-I-N diodes); in this case the phase shifter 1261, 1262 is an electro-optic phase shifter. For example, mere electrodes may be placed on both sides of a waveguide portion to allow an electric field to be applied through the waveguide portion.

The following describes preferred embodiments, where the phase shifters 1261, 1262 are realized as thermo-optic phase shifters. Several configurations can be exploited, in which the phase shifters 1261, 1262 can be placed at different portions of the two waveguides 1241, 1242. In all cases, the phase shifters 1261, 1262 include tunable elements. In the example of FIGS. 3A and 3B, each stage 122 forms an MZI, which is constituted by two directional couplers 1251, 1252 and a phase shifter (the first phase shifter 1261 in FIG. 3A). In this example, the weight of any stage 122 is determined by the two directional couplers 1251, 1252 and the phase shifters 1261, 1262.

The optical FIR filter 12 may notably be configured so as to mimic an N-th order complex FIR filter, with a view to performing convolution operations, e.g., the lattice filter 12 may include N+1 convolution stages (COVS), where each COVS comprises a tunable MZI, as assumed in FIG. 3B. That is, the phase in one of the arms can be tuned via the MZI. The outputs of the MZI are connected to a short waveguide (short path) and a long waveguide (long path); the length difference between the paths is chosen such that the propagation delay difference corresponds to the period of the input signal.

Several configurations can be contemplated for the phase shifters 1261, 1262. As for instance seen in FIG. 3A, the first phase shifter 1261 may be arranged at a first portion of the first waveguide 1241, between the two directional couplers 1251, 1252. Meanwhile, the second phase shifter 1262 can be arranged at a second portion of the second waveguide 1242; this second portion is in output of the second waveguide 1242. As seen in FIG. 3B, the four-terminal stages 122 are connected in an alternated fashion in that case. That is, the first waveguide 1241 and the second waveguide 1242 of one stage connect to the second waveguide 1242 and the first waveguide 1241 of the next stage. In variants, however, the phase shifters 1261, 1262 can be arranged at other locations. For example, the first phase shifter 1261 may be placed on the upper arm 1242, between the two directional couplers, while the second phase shifter 1262 may be placed on the lower arm 1241, in output of the meander formed by the first waveguide 1241, i.e., the longest of the two waveguides.

Figure 5A:
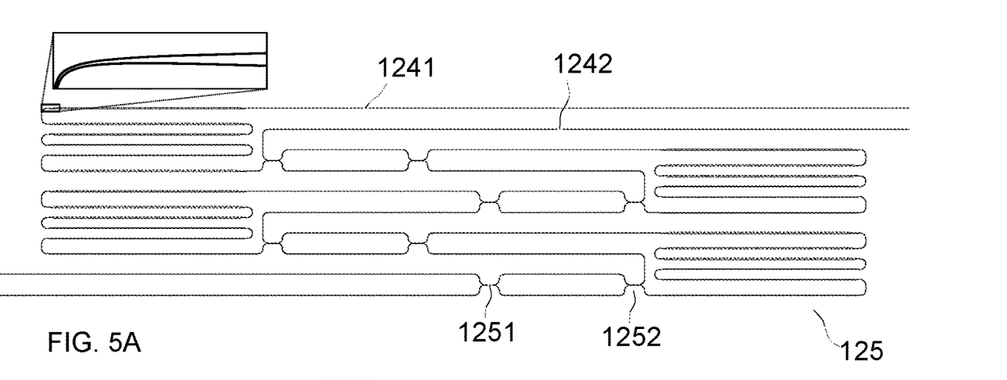
FIG. 5A shows a top view of the mask layout, where only the silicon photonic waveguides are shown, for clarity.
Figure 5B:
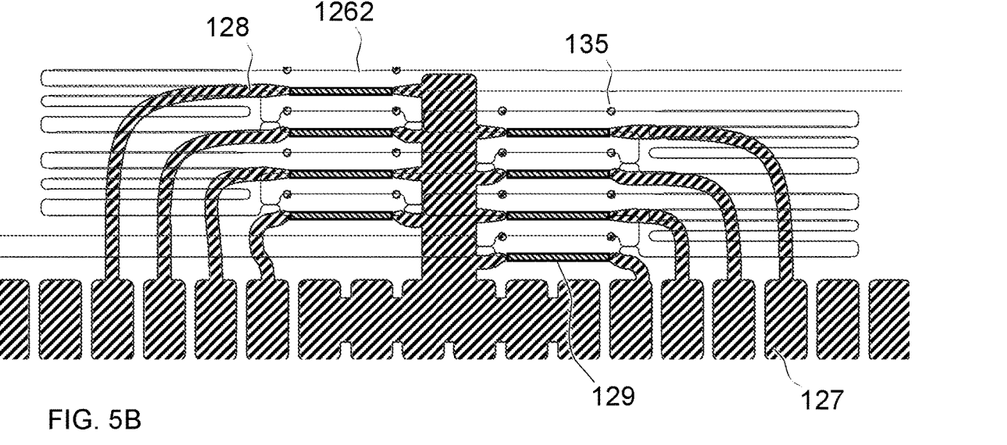
FIG. 5B is a similar top view, onto which heaters (forming part of phase shifters) and electrical leads and contacts are overlaid.
Figure 5C:
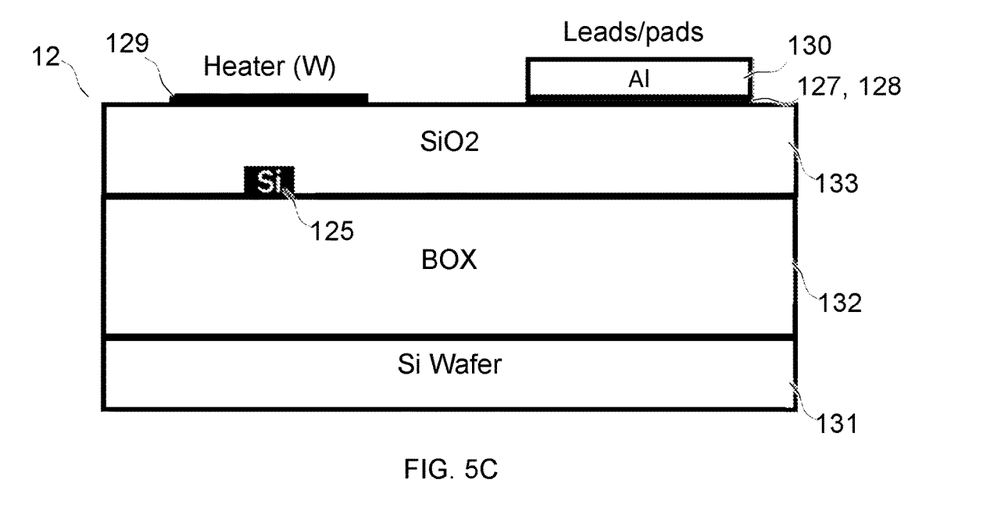
FIG. 5C is a 2D, cross-sectional view of a part of a silicon photonic chip designed to form an optical lattice filter such as shown in FIG. 5B.

In each of the examples of FIGS. 3A-B and 5A-C, the phase shifters 1261, 1262 are thermo-optic phase shifters, involving heaters 129. That is, the apparatus 1 comprises an electrical circuit, which includes heaters 129, see FIGS. 5B and 5C. The heaters 129 are in thermal communication with respective portions of the waveguides, as best seen in FIG. 5C, i.e., such heaters 129 constitute, together with respective waveguide portions, thermo-optic phase shifters. The electrical circuit is configured to apply an electrical current to the heaters 129 of each of the delay stages 122, which makes it possible to set the weights 126 of the delay stages 122, in operation.

The intended operation of the stages 122 is now described, referring back to FIGS. 3A and 3B. A phase shift is applied in one of the arms 1241, 1242, via a respective phase shifter (e.g., heater) 1261, 1261. As said, electrodes or P-I-N diodes may be used to that aim, in variants. The directional couplers cause an interference, which translates into an amplitude variation of the optical signal. This makes it possible to adjust the optical power ratio between the two arms, i.e., to tune how much power goes to which output arm. In reference to FIG. 3A, the input light is split equally at the first coupler 1251 before it propagates through the two waveguide arms 1241, 1242 and the first phase shifter 1261.

At the output of the MZI 1251, 1252, 1261, the light from both arms 1241, 1242 is combined and interferes. The amplitude and phase of the output signal can thus be tuned in accordance with the phase shifter settings.

In preferred embodiments, the apparatus 1 is built as or includes a silicon (Si) photonic platform, as now described in reference to FIGS. 1 and 5A-5C. In particular, the apparatus 1 may include a Si photonic chip, itself including the optical FIR filter 12. As best seen in FIG. 5C, the Si photonic chip has a layer structure. This layer structure notably includes a silicon on insulator (SOI) layer stack, having a silicon-insulator-silicon layer structure. The SOI includes a Si handle wafer 131, an oxide layer 132 (on top of the Si handle wafer), and a topmost Si layer 125 (on top of the oxide layer). The topmost Si layer 125 can advantageously be structured so as to form the two waveguides 1241, 1242 of each of the four-terminal stages 122. The layer stack further includes an electrically insulating layer 133 (e.g., $SiO_2$), which clads the topmost Si layer 125 (structured as waveguides). The heaters 129 are arranged on top of the electrically insulating layer 133, vis-à-vis respective portions of the waveguides. As further seen in FIGS. 5B and 5C, electrical leads 128 and electrical pads 127 are arranged on top of the electrically insulating layer 133. The electrical leads 128 connect the heaters 129 to the electrical pads 127.

For instance, 220 nm thick Si waveguides may be structured on a SOI substrate and cladded with 1 μm $SiO_2$ 133. Thin heaters (100 nm, tungsten) may form the heaters 129 above the Si waveguides as well as the leads 128 and pads 127. An aluminum layer 130 (e.g., of 500 nm) is preferably overlaid on the leads 128 and pads 127 to reduce the resistance. This structure and other structures described herein can be achieved using known lithographic methods.

As said, electrodes and other electric or electronic devices may be used in variants to heaters, to set the weights. Using heaters ensures an easy fabrication methods. However, using heaters results in rather slow phase-shifts as the thermo-optic effect is a rather slow process. Thus, P-I-N modulation based on the plasma dispersion effect may be contemplated in place of heaters, using a P-I-N diode mounted across the waveguide, to achieve a faster process. A P-I-N diode is a diode that includes a wide, undoped intrinsic semiconductor region between p-type and n-type semiconductor regions. In further variants, modulators based on other electro-optic effects may also be used.

FIGS. 5A and 5B show a mask layout of an optical lattice filter with four convolution stages, corresponding to respective stages 122 in the linear depiction of FIG. 3B. FIG. 5A is a partial depiction, mainly showing the Si photonic waveguides depicted as black lines. The convolution stages are fully shown in FIG. 5B, where the tungsten heaters (129) are represented as long rectangles with diagonal stripes downward. The design shown in FIG. 5B has been optimized for an input data rate of 32 GBd, corresponding to a delay difference of 31.25 ps between the long path and the short path. In FIG. 5B, the shapes formed by the leads 128 and pads 127 are filled with wide diagonal stripes upward. All heaters 129 share a common central ground pad in this example.

Numeral references 135 correspond to residuals from the mask used in the example design of FIG. 5B. However, such terminals are not connected and do accordingly not play any role. Contrary to the depiction of FIG. 5B, additional metal parts may be placed on top of the remaining waveguide portions (those not overlaid by heaters 129) between the residual terminals 135 to balance optical losses. That is, additional, unconnected metal bars (similar to heaters 129) may possibly be included on the second MZI arms and the long delay lines to ensure the design is symmetric. The inset (top left) in FIG. 5A shows the conversion from a standard waveguide to an extra wide waveguide, which is used to decrease propagation loss in straight waveguide sections of the long path.

A preferred flow of operation is shown in FIG. 6. At step S10, an apparatus 1 such as shown in FIG. 1 is provided. The apparatus 1 includes an optical FIR filter 12, which is preferably in the form of a lattice filter as described above. Parameters of the transformation to be applied are accessed at step S20. At step S30, the filter weights are mapped in accordance with the transformation parameters and a predetermined scan path, the latter to be used to scan the target data. At step S40, the filter weights are set in accordance with the transformation parameters, taking the mapping of the weights 126 into account. For instance, each of the four-terminal stages 122 may include phase shifters 1261, 1262, e.g., thermal phase shifters, as assumed in FIGS. 3A and 5B. In that case, each of the optical phase shifters 1261, 1262 may be tuned at step S40 by heating corresponding heaters to set the weights 126. The data to be transformed are accessed from a database (e.g., stored on a computer, provided in step S10) at any convenient point in time (e.g., at step S20) before step S50. At step S50, the accessed data are scanned according to the predetermined scan path to map the initial data onto a 1D data stream. At step S60, an optical signal is generated, e.g., via the transmitter 11 and fed into the optical FIR filter 12. This signal encodes optical signal samples carrying the 1D data stream. Output samples are collected at step S70, e.g., via a receiver 13 (FIG. 1), to obtain a selection of output samples that are representative of the transformed data. As explained earlier, the output samples may have to be sub-sampled, this depending on the intended transformation. The transformed data can eventually be reconstructed thanks to any suitable reconstruction unit 14 (FIG. 1), e.g., a computer, which may be the same computer that stores the initial data.

Preferred embodiments as described herein concern Si photonic convolution accelerators that are based on two-port optical lattice, FIR filters. They leverage methods to set arbitrary complex valued kernels, using an accurate system model and a characterization routine to calibrate the phase response of the optical FIR filter. Methods as disclosed herein can be used to compute not only 1D but also r-dimensional convolutions (r>1) with the optical FIR filter, by rearranging the input data and down-sampling its output. Applications can notably be made to edge detection and pattern recognition in data streams, image processing operations (like blurring or edge detection), as well as convolutional neural networks (CNNs). A demonstrator device was fabricated, which enables convolutions at a data rate of 12.5 GBd, performing pattern recognition in pseudorandom binary sequences (PRBSs) and edge detection in images. The present approach may, in principle, allow efficiencies on the order of 5 TOps/W with an optimized device design, matching the performance of current state of the art electrical convolution accelerators. Assuming an input data rate of 32 GBd, image sizes of 1 Megapixel, and a 3×3 filter size, the performance/watt that can be achieved in embodiments ranges from 320 GOps/W (using tungsten heaters) to 1 TOps/W (when using improved modulators), which is comparable to state of the art systems based on field-programmable gate arrays (FPGAs), datacenter chips, cards, and systems as well as low-power application specific integrated circuits.

Embodiments can notably be used to perform convolution operations, as heavily used in CNNs for image processing and classification or to pre-process images (e.g., edge detection). As evoked above, optical convolution processing can be a good alternative in terms of operations/watt for convolutional layers. CNNs use a variety of filter sizes, most of them being typically quite small, ranging from 3×3 to 10×10 kernel sizes.

While the present disclosure has been described with reference to a limited number of embodiments, variants, and the accompanying drawings, it will be understood by those skilled in the art that various changes may be made, and equivalents may be substituted without departing from the scope of the present disclosure. The descriptions of the various embodiments of the present disclosure have been presented for purposes of illustration, but are not intended to be exhaustive or limited to the embodiments disclosed. In particular, a feature (device-like or method-like) recited in a given embodiment, variant or shown in a drawing may be combined with or replace another feature in another embodiment, variant, or drawing, without departing from the scope of the present disclosure. Various combinations of the features described in respect of any of the above embodiments or variants may accordingly be contemplated, that remain within the scope of the appended claims. In addition, many minor modifications may be made to adapt a particular situation or material to the teachings of the present disclosure without departing from its scope. Therefore, it is intended that the present disclosure not be limited to the particular embodiments disclosed, but that the present disclosure will include all embodiments falling within the scope of the appended claims. In addition, many other variants than explicitly touched above can be contemplated. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method of processing data, wherein the method comprises:

providing an optical finite impulse response (FIR) filter, wherein the optical FIR filter comprises several delay stages having weights set in accordance with parameters of a transformation to be applied by the optical FIR filter, the delay stages configured to impose a delay matched to a given input data period corresponding to a given input sample rate, and wherein the optical FIR filter is a lattice filter in two-port lattice form, the delay stages being four-terminal lattice filter stages that are optically connected in series, and the four-terminal lattice filter stages comprising two waveguides and two phase shifters, the two phase shifters formed at respective portions of the two waveguides;

coupling an optical signal into the optical FIR filter, wherein the optical signal carries a data stream of input samples encoded at the given input sample rate, the data stream representing data to be processed; and collecting output samples in an output data stream carried by an output optical signal obtained in output of the optical FIR filter to obtain a set of output samples that are representative of processed data.

2. The method according to claim 1, wherein the method further comprises:

reconstructing transformed data based on the set of the output samples obtained.

3. The method according to claim 1, wherein
the output samples are collected by sub-sampling the output samples in the output data stream, at a sub-sampling rate determined in accordance with the parameters of the transformation applied by the optical FIR filter.

4. The method according to claim 1, wherein
the transformation to be applied is an r-dimensional convolution, r≥1, having a kernel of size $k^r$ with given kernel values.

5. The method according to claim 4, wherein
r≥2,
the optical FIR filter comprises at least $k^r-1$ delay stages, the weights of which are set in accordance with the given kernel values, and
the output samples are collected by sub-sampling the output samples in the output data stream at a sub-sampling rate of $k^{1-r}$, whereby the set of output samples obtained is a selection of the output samples carried in the output data stream, the selection including every $k^{r-1}$-th sample of at least a subset of the output samples in the output data stream.

6. The method according to claim 4, wherein
data to be transformed are d-dimensional data, d≥2,
the method further comprises, prior to coupling the optical signal into optical input of the optical FIR filter, scanning through the d-dimensional data according to a predetermined scan path, and
the weights of the delay stages are set in accordance with the given kernel values, consistently with the predetermined scan path.

7. The method according to claim 1, wherein
the method further comprises, prior to coupling the optical signal into optical input of the optical FIR filter, setting the weights in accordance with the parameters of the transformation to be applied.

8. The method according to claim 1, wherein
the method further comprises, prior to setting the weights, mapping the weights in accordance with the parameters of the transformation to be applied, whereby the weights are set in accordance with the mapping of the weights.

9. The method according to claim 1, wherein
the four-terminal lattice filter stages comprise optical phase shifters, and
the method further comprises, prior to coupling the optical signal into optical input of the optical FIR filter, tuning the optical phase shifters to set the weights in accordance with the parameters of the transformation to be applied.

10. An apparatus for processing data, wherein the apparatus comprises:
an optical finite impulse response (FIR) filter comprising several delay stages having weights set in accordance with parameters of a transformation to be applied by the optical FIR filter, the delay stages configured to impose a delay matched to a given input data period corresponding to a given input sample rate, wherein the optical FIR filter is a lattice filter, and the lattice filter is in two-port lattice form, the delay stages being four-terminal lattice filter stages that are optically connected in series, the four-terminal lattice filter stages comprising two waveguides and two phase shifters, the two phase shifters formed at respective portions of the two waveguides;
a transmitter connected to an optical input of the optical FIR filter and configured to couple an optical signal into the optical FIR filter, wherein, in operation, the optical signal carries a data stream of input samples encoded at the given input sample rate, the data stream representing data to be processed; and
a receiver connected to an optical output of the optical FIR filter and configured to collect output samples in an output data stream carried by an output optical signal obtained in output of the optical FIR filter to obtain a set of the output samples that are representative of the transformation.

11. The apparatus according to claim 10, wherein
the apparatus further comprises a data reconstruction unit connected to the receiver and configured to reconstruct transformed data based on the set of the output samples obtained.

12. The apparatus according to claim 10, wherein the receiver is further configured to collect the output samples by sub-sampling the output samples in the output data stream, at a sub-sampling rate determined in accordance with the parameters of the transformation applied by the optical FIR filter.

13. The apparatus according to claim 10, wherein
in the four-terminal lattice filter stages,
the two waveguides are arranged so as to form two directional couplers, and
a length difference between optical paths enabled by the two waveguides is such that a propagation delay difference between the optical paths corresponds to the given input data period.

14. The apparatus according to claim 13, wherein, in the four-terminal lattice filter stages,
the two waveguides correspond to a first waveguide and a second waveguide;
the respective portions of the two waveguides correspond to a first portion of the first waveguide and a second portion of the second waveguide, respectively;
a first phase shifter of the two phase shifters is arranged at the first portion of the first waveguide between the two directional couplers;
a second phase shifter of the two phase shifters is arranged at the second portion of the second waveguide, the second portion being in output of the second waveguide; and
the four-terminal lattice filter stages are connected in an alternated fashion, such that the first waveguide and the second waveguide of one of the four-terminal lattice filter stages each connects to the second waveguide and the first waveguide, respectively, of a next one of the four-terminal lattice filter stages.

15. The apparatus according to claim 14, wherein
the first waveguide is a longest one of the two waveguides, and
the two directional couplers and the first phase shifter are configured as a phase-tunable Mach-Zehnder interferometer.

16. The apparatus according to claim 14, wherein
the two phase shifters are thermo-optic phase shifters;
the apparatus further comprises an electrical circuit, which includes heaters that form part of the thermo-optic phase shifters;
the heaters are in thermal communication with said respective portions of the two waveguides; and
the electrical circuit is configured to apply an electrical current to the heaters of the delay stages, so as to be able to set the weights of the delay stages.

17. The apparatus according to claim 16, wherein the apparatus comprises a silicon photonic chip including the optical FIR filter.

18. The apparatus according to claim 17, wherein the silicon photonic chip has a layer structure, which includes:
- a silicon-insulator-silicon layer stack, including a silicon handle wafer, an oxide layer on top of the silicon handle wafer, and a topmost silicon layer on top of the oxide layer, the topmost silicon layer structured so as to form the two waveguides of the four-terminal lattice filter stages;
- an electrically insulating layer cladding the topmost silicon layer, the heaters arranged on top of the electrically insulating layer, and arranged at the respective portions of the two waveguides; and
- electrical leads and electrical pads arranged on top of the electrically insulating layer, wherein the electrical leads connect the heaters to the electrical pads.

* * * * *